(12) United States Patent
Komatsu et al.

(10) Patent No.: US 6,208,208 B1
(45) Date of Patent: Mar. 27, 2001

(54) OPERATIONALLY AMPLIFYING METHOD AND OPERATIONAL AMPLIFIER

(75) Inventors: Yuji Komatsu; Akira Yukawa; Yasuhiro Taguchi, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/294,570

(22) Filed: Apr. 20, 1999

(30) Foreign Application Priority Data

Apr. 20, 1998 (JP) .................................................. 10-109678

(51) Int. Cl.$^7$ ........................................................ H03F 3/45
(52) U.S. Cl. ............................................. 330/255; 330/267
(58) Field of Search .................................... 330/255, 267, 330/268

(56) References Cited

U.S. PATENT DOCUMENTS

| | | | | |
|---|---|---|---|---|
| 4,015,212 | * | 3/1977 | Miyata | 330/13 |
| 4,135,162 | * | 1/1979 | Takahashi | 330/255 |
| 5,754,078 | * | 5/1998 | Tamagawa | 330/255 |
| 5,789,980 | * | 8/1998 | Nagata et al. | 330/253 |
| 6,005,440 | * | 12/1999 | Okamoto | 330/253 |

FOREIGN PATENT DOCUMENTS 62-82704  4/1987  (JP) .

5-95231  4/1993  (JP) .

OTHER PUBLICATIONS

Japanese Office Action issued Sep. 12, 2000 in a related application with English translation of relevant portions.

* cited by examiner

*Primary Examiner*—Benny Lee
*Assistant Examiner*—Henry Choe
(74) *Attorney, Agent, or Firm*—Ostrolenk, Faber, Gerb & Soffen, LLP

(57) ABSTRACT

An operational amplifier circuit including a differential amplifier circuit and a current mirror circuit. The differential amplifier circuit amplifies a signal which enters a non-inverted input terminal and an inverted input terminal. The differential amplifier circuit receives resulting differential currents from an inverted current inflow terminal and a non-inverted current inflow terminal, and outputs corresponding differential currents from an inverted current outflow terminal and an non-inverted current outflow terminal to the current mirror circuit. The differential current flowing in the terminal is converted into a voltage by a load transistor so that the voltage drives a p-channel transistor, whereas the corresponding differential current flowing out from the terminal is converted into a voltage by a load transistor so that the voltage drives an n-channel transistor.

15 Claims, 8 Drawing Sheets

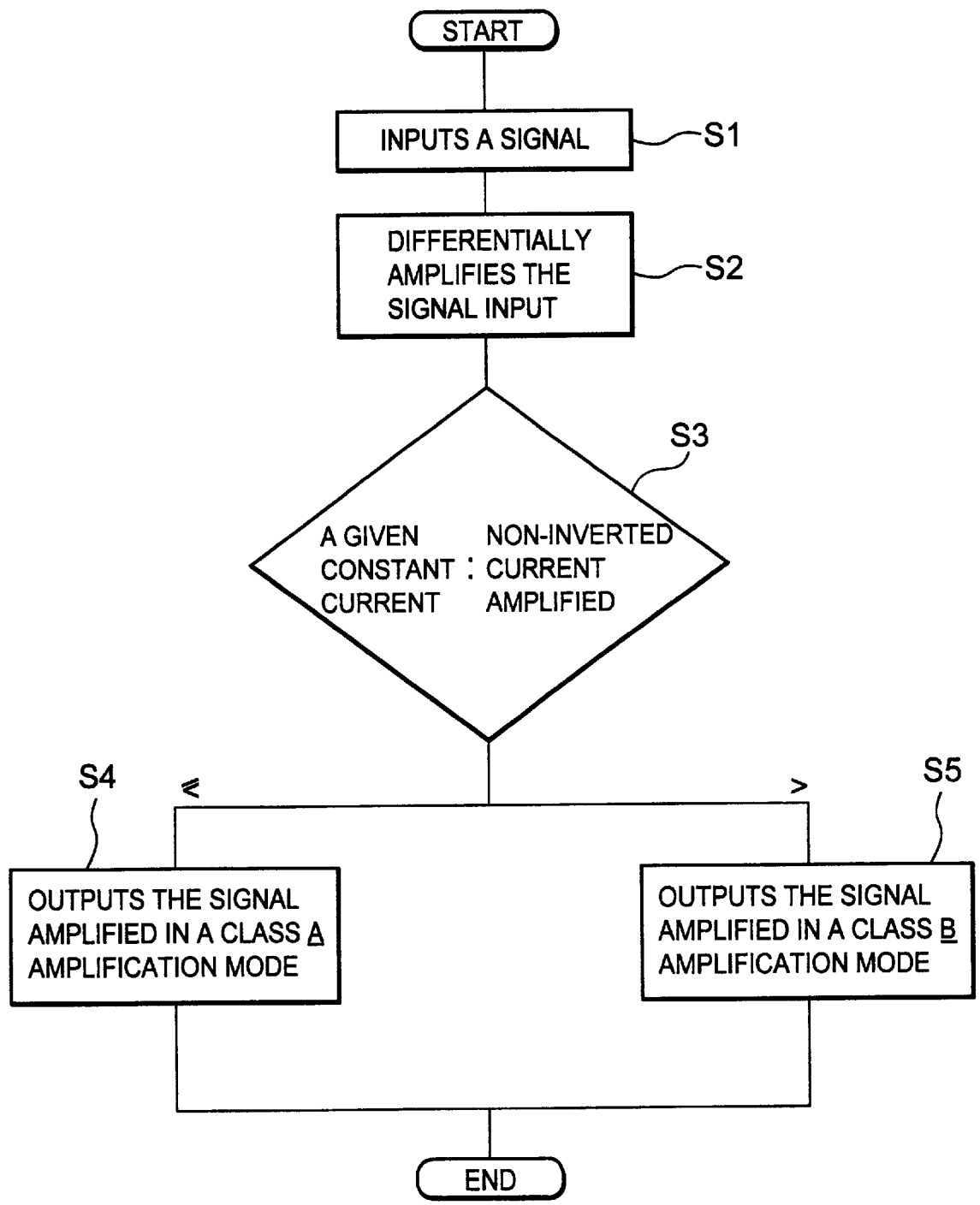

OPERATIONALLY AMPLIFYING METHOD AND OPERATIONAL AMPLIFIER

BACKGROUND OF THE INVENTION

1. Field of the Invention

The present invention relates to an operational amplifier method and an operational amplifier. It specifically relates to an operational amplifier circuit with a low dissipation current and a large drive current, which is powered by a low voltage power supply.

2. Description of the Related Art

Recently, to embed in a system LSI (Large Scale Integrated circuit) for a portable apparatus such as an electronic notebook or a digital watch, powered by a primary battery, the CMOS (Complementary Metal Oxide Semiconductor) operational amplifier circuit (which has been made up using a CMOS manufacturing process) is frequently utilized.

These portable devices driven by the battery have to function with dissipation currents ranging from several microamperes to several milliamperes with the help of a power supply voltage of 1.5 volts or less. Accordingly, an operational amplifier circuit, where functions are powered by a low power supply voltage with a low dissipation current, is required.

In addition, an operational amplifier circuit with a high output capability as well as a capability of operating with a low dissipation current, powered by a low voltage supplied by a power supply, is also in demand for a portable apparatus. It is desired, for example, to further decrease a dissipation current spent in a portable apparatus during its steady-state operation, and drive a loudspeaker via the operational amplifier circuit by the output of a D/A (Digital to Analog) converter, which along with an A/D (Analog to digital) converter has been embedded on the same chip as the operational amplifier circuit.

To respond to the request, a folded cascode-type operational amplifier circuit 700 (hereafter, referred to as just "operational amplifier circuit") as shown in FIG. 1 has been proposed.

The operational amplifier circuit 700 is comprised of: a folded cascode-type operational amplifier circuit 71 including n-channel transistors 74 and 75 which make up a pair of differential transistors and a current mirror circuit 76. Also included is push-pull output circuit 72 including a p-channel output transistor 77, a n-channel output transistor 78, a condenser for phase compensation Cc, and an output terminal 79. A bias circuit 73 supplies the folded cascade circuit 71 and the push-pull output circuit 72 with a bias voltage.

Upon application of an input signal to gates G74 and G75 of the n-channel transistors 74 and 75 which make up a pair of differential transistors, a signal amplified by the folded cascode circuit 71 is output to a common gate terminal A of the current mirror circuit 76 and an output terminal B of the folded cascode circuit 1, amplified by the p-channel output transistor 77 and the n-channel output transistor 78, and output to the output terminal 79.

The conventional operational amplifier 700 as described above has a feature where: the range of input voltages is wide; the range of output voltages is extended to the earth voltage; and it is possible to function with the help of a low voltage of 1 volt or less supplied by a power supply.

However, the operational amplifier circuit 700 is not configured in such a manner that the p-channel output transistor 77 is driven by the output of the differential amplifier circuit. In addition, it also does not comprise a circuit configuration used in setting an idling current for the n-channel output transistor 78.

Thus, there is a shortcoming with the operational amplifier circuit 700 where the push-pull output circuit 72 operates as a class A amplifier so that the maximum output current of the operational amplifier circuit 700 is limited to an amount which is equal to or less than the idling current flowing through the p-channel output transistor 77.

Furthermore, when the push-pull output circuit 72 operates and outputs a high amplitude of signal, the shape of the high amplitude of signal is asymmetric with respect to the middle point of voltage. This causes an increase in an odd-order harmonic distortion.

SUMMARY OF THE INVENTION

Accordingly, the objective of the present invention is to provide an operational amplifier method and an operational amplifier, powered by a low voltage power supply such as a dry element cell, which operates with a low dissipation current and a high drive capability.

To attain the above objective, an operationally amplifying method according to an aspect of the present invention is provided comprising: a first amplifying step (S4) of amplifying an input signal in a class A amplification mode when the input signal is small; and a second amplifying step (S5) of amplifying an input signal in a class B amplification mode when the input signal is large. An embodiment according to this method is shown in FIG. 8.

According to another aspect of the present invention, an operational amplifier is provided comprising: an amplifier (1) which amplifies an input signal; an idling current provider (2) which provides a constant current; and a driver (104, 204) which outputs a output signal in accordance with the sum of the input signal amplified by the amplifier (1) and the constant current provided by the idling current provider (2), wherein, the driver (104, 204) functions in a class A amplification mode when the input signal is small, otherwise, it functions in a class B amplification mode when the input signal is not small. Embodiments according to the above invention are shown in FIGS, 2, 3, 6, and 7.

BRIEF DESCRIPTION OF DRAWINGS

The above and other objects, features and advantages of the present invention will become apparent from the following detailed description when taken in conjunction with the accompanying drawings, wherein:

FIG. 8 is a flowchart explaining an operationally amplifying method according to a fifth embodiment of the present invention.

DETAILED DESCRIPTION OF THE PREFERRED EMBODIMENTS

Figure 1:
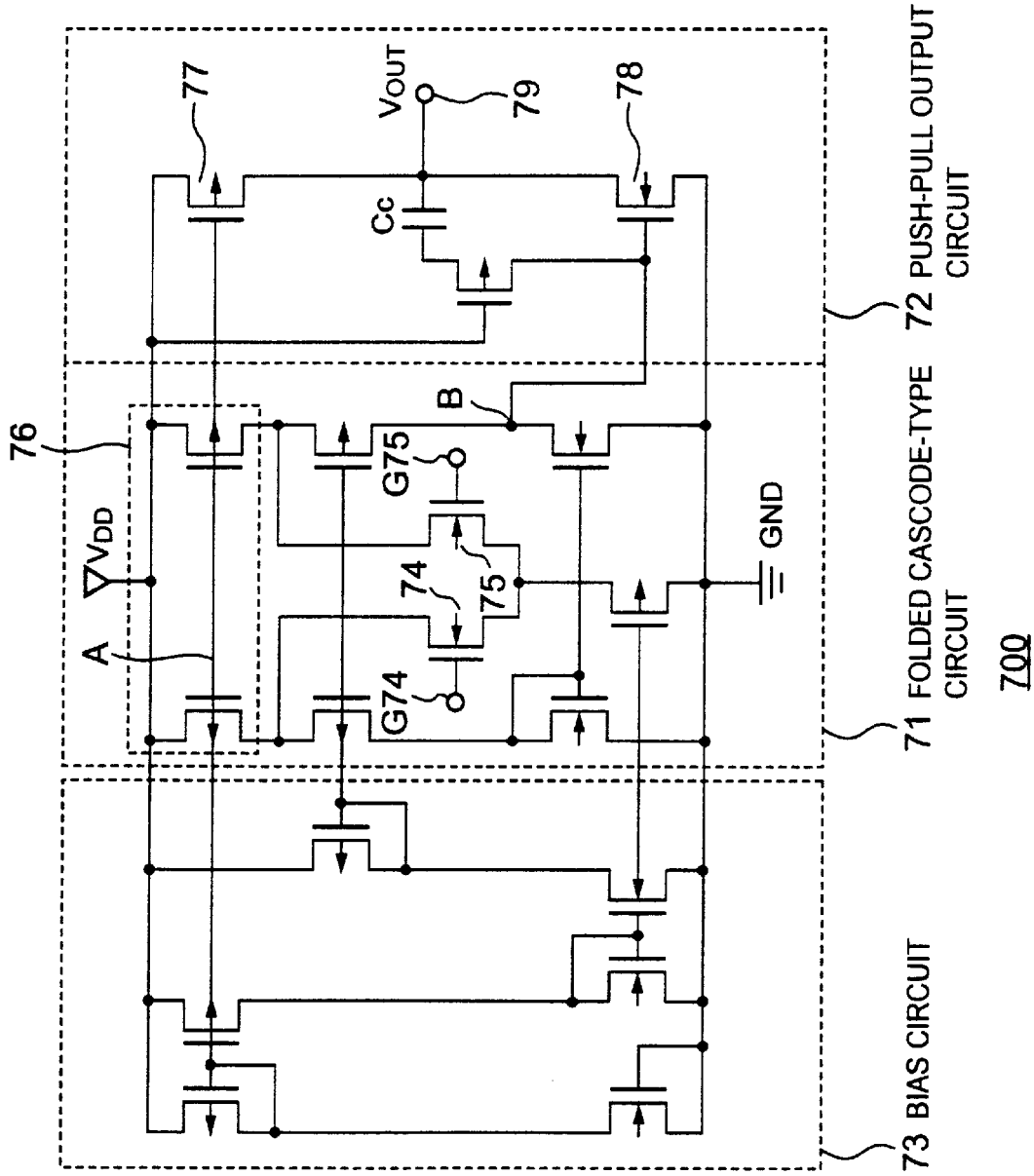
FIG. 1 is a circuit diagram showing the conventional operational amplifier.
Figure 2:
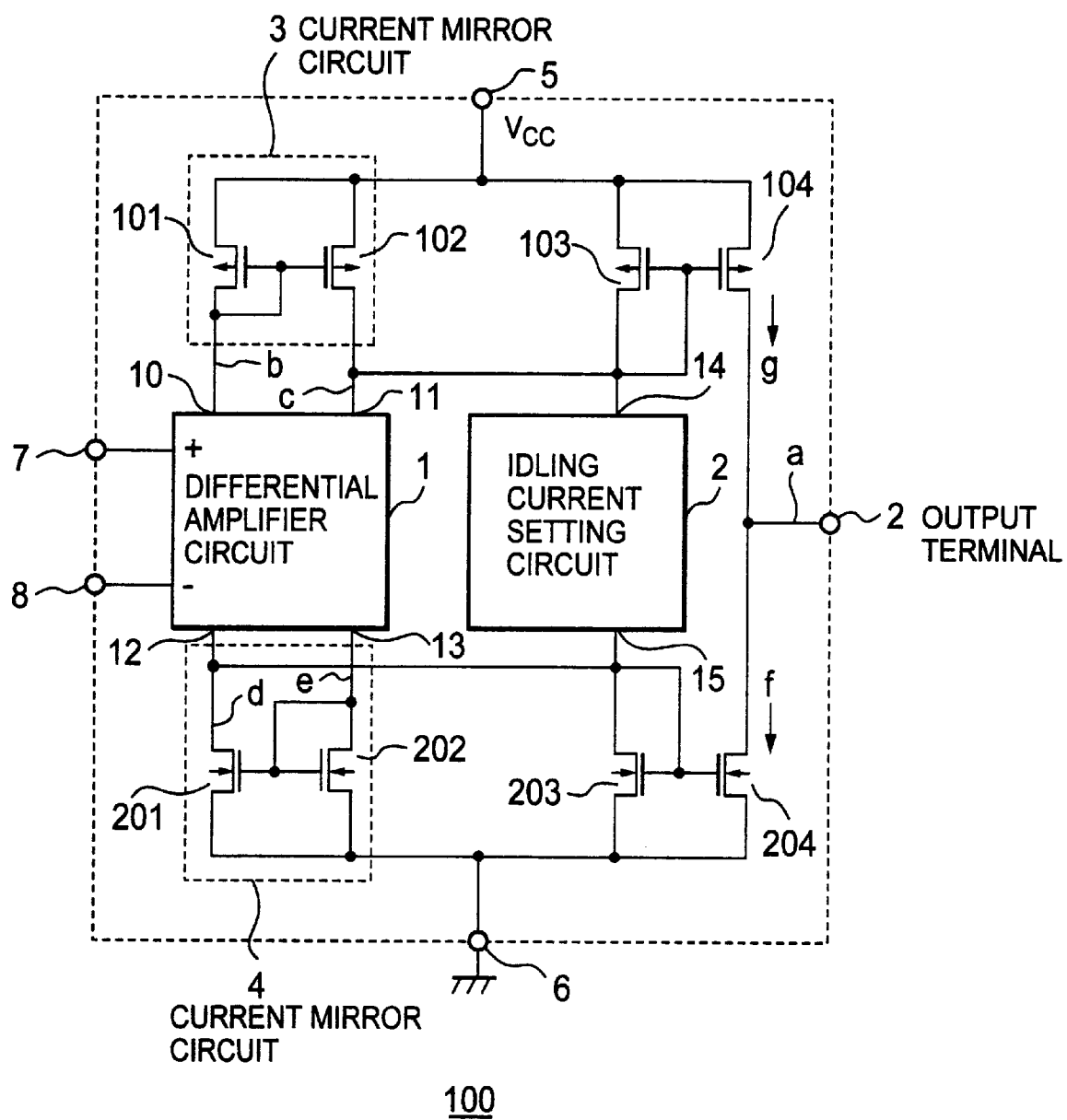
FIG. 2 is a circuit diagram showing the configuration of an operational amplifier according to a first embodiment of the present invention.

The basic idea of an operational amplifier circuit 100 according to the present invention will be explained with reference to FIG. 2.

The operational amplifier circuit 100 according to the present invention is comprised of: a plurality of external terminals such as an external terminal or a power supply terminal 5, a ground terminal 6, a non-inverted input terminal 7, an inverted input terminal 8, an output terminal. Operational amplifier 100 also includes a differential amplifier circuit 1, current mirror circuits 3 and 4, an idling current setting circuit 2, load transistors 103 and 203, and output transistors 104 and 204. The differential amplifier circuit 1 amplifies a signal which enters the non-inverted input terminal 7 and the inverted input terminal 8. The differential amplifier circuit 1 receives resulting differential currents from an inverted current inflow terminal 10 and an non-inverted current inflow terminal 11, and outputs out corresponding differential currents from an inverted current outflow terminal 12 and a non-inverted current outflow terminal 13.

The current mirror circuit 3, made up of p-channel transistors 101 and 102, provides the inverted current inflow terminal 10 and the non-inverted current inflow terminal 11 of the differential amplifier circuit 1 with the differential currents. Accordingly, the differential amplifier circuit 1 outputs corresponding differential currents to the current mirror circuit 4, which is made up of n-channel transistors 201 and 202, from the inverted current outflow terminal 12 and the non-inverted current outflow terminal 13.

In addition, the non-inverted current inflow terminal 11 is connected to: the gate of the load transistor 103, which is a p-channel transistor and which is internally connected as a diode; the gate of the p-channel output transistor 104; and a constant-current inflow terminal 14 of the idling current setting circuit 2. The differential current which flows in the non-inverted current inflow terminal 11 is converted into a voltage by the load transistor 103, so that the voltage drives the p-channel output transistor 104.

The inverted current outflow terminal 12 is connected to: the gate of the load transistor 203, which is a n-channel transistor and which is internally connected as a diode; the gate of the n-channel output transistor 204; and a constant-current outflow terminal 15 of the idling current setting circuit 2. The differential current which flows out from the non-inverted current inflow terminal 12 is converted into a voltage by the load transistor 203, so that the voltage drives the n-channel output transistor 204.

The drain of the p-channel output transistor 104 and the drain of the n-channel output transistor 204 are both connected to the output terminal 9. The operational amplifier circuit 100 amplifies a signal which enters the non-inverted input terminal 7 and the inverted input terminal 8, outputting a resulting signal amplified to the output terminal 9.

Next, the operation of the operational amplifier circuit 100 according to the first embodiment of the present invention will be explained below in detail with reference to FIG. 2.

Application of the same voltages to the non-inverted input terminal 7 and the inverted input terminal 8 causes an output of balanced output currents from the differential amplifier circuit 1 so that the same amount of currents are pulled in from the inverted current inflow terminal 10 and the non-inverted current inflow terminal 11.

The idling setting circuit 2 provides the load transistors 103 and 203, each being internally connected as a diode, with constant currents, respectively. This allows an idling current, which flows through both the p-channel output transistor 104 and the n-channel output transistor 204, to remain constant. The load transistor 103 and the p-channel output transistor 104 make up a current mirror circuit, and the load transistor 203 and the n-channel output transistor 204 make up a current mirror circuit as well.

The inverted current inflow terminal 10 of the differential amplifier circuit 1 is connected to the power supply terminal 5 via the load transistor 101, which is internally connected as a diode making up the current mirror circuit 3. In the same manner, the inverted current inflow terminal 11 is connected to the power supply terminal 5 via the load transistor 103, which is internally connected as a diode so that the voltages at the inverted current inflow terminal 10 and the non-inverted current inflow terminal 11 are maintained as almost the same and stable.

Furthermore, the non-inverted current outflow terminal 13 of the differential amplifier circuit 1 is connected to the ground terminal 6 via a load transistor 202 which is internally connected as a diode making up a current mirror circuit 4. In the same manner, the inverted current inflow terminal 12 is connected to the ground terminal 6 via the load transistor 203 which is internally connected as a diode, so that the voltages at the inverted current inflow terminal 12 and the non-inverted current inflow terminal 13 are maintained as almost the same and stable.

Since the differential amplifier circuit 1 is then in a balanced state, a possible current flow between the non-inverted current inflow terminal 11 and the constant-current inflow terminal 14 is next to nothing even though these terminals 11 and 14 are connected to each other. In the same manner, a possible current flow between the inverted current outflow terminal 12 and the constant-current outflow terminal 15 is also next to nothing. This fact allows the idling current setting circuit 2 to optionally set an idling current, which flows through both the p-channel output transistor 104 and the n-channel output transistor 204.

In the case where an alternative signal is applied between the non-inverted input terminal 7 and the inverted input terminal 8, differential currents generated by the differential amplifier circuit 1 independent from the idling current, allow a decrease in a voltage at the non-inverted current inflow terminal 11, during a positive phase period of voltage of the alternative signal, so that the p-channel output transistor 104 turns on. At the same time, the differential currents also allow a decrease in the voltage at the inverted current outflow terminal 12 so that the n-channel output transistor 204 turns off. On the other hand, a negative phase period of voltage of an input signal allows the n-channel output transistor 204 to turn on. Accordingly, the p-channel output transistor 104 turns off.

With this configuration, it is possible to make up an operational amplifier, which functions on the class A and B operation basis, where a stable idling current is provided when no signal enters whereas a large amount of current can be output when a signal enters.

Furthermore, in the operational amplifier circuit 100 according to the present invention, the specification of a load driving capability of driving a load (not shown in drawings) which is connected to the output terminal 9 and the specification of an idling current, which flows through the output stage made up of the p-channel output transistor 104 and the n-channel output transistor 204, can be independently determined. Therefore, a capability of driving a heavy load with a low dissipation current can be provided.

Furthermore, during the operation for a low amplitude of signal, the voltages of the inverted current inflow terminal 10 and the non-inverted current inflow terminal 11 of the differential amplifier circuit 1 are well-balanced. In addition to that, the voltages of the inverted current inflow terminal 12 and the non-inverted current inflow terminal 13 are also well-balanced. Therefore, there is a feature where a possible change in the voltage supplied by the power supply cannot be of great influence so that the SERVER (Supply Voltage Rejection Ratio) is high.

Furthermore, the output stage is configured by a complementary common source circuit, which is made up of the p-channel output transistor 104 and the n-channel output transistor 204 so that allowable output voltages range from almost the earth voltage to approximately the power supply voltage.

Next, a detailed operational amplifier circuit according to a second embodiment of the present invention will be described with reference to FIG. 3. It is noted that identical reference numerals to those in FIG. 2 are attached to the same elements in FIG. 3 as those in FIG. 2.

Figure 3:
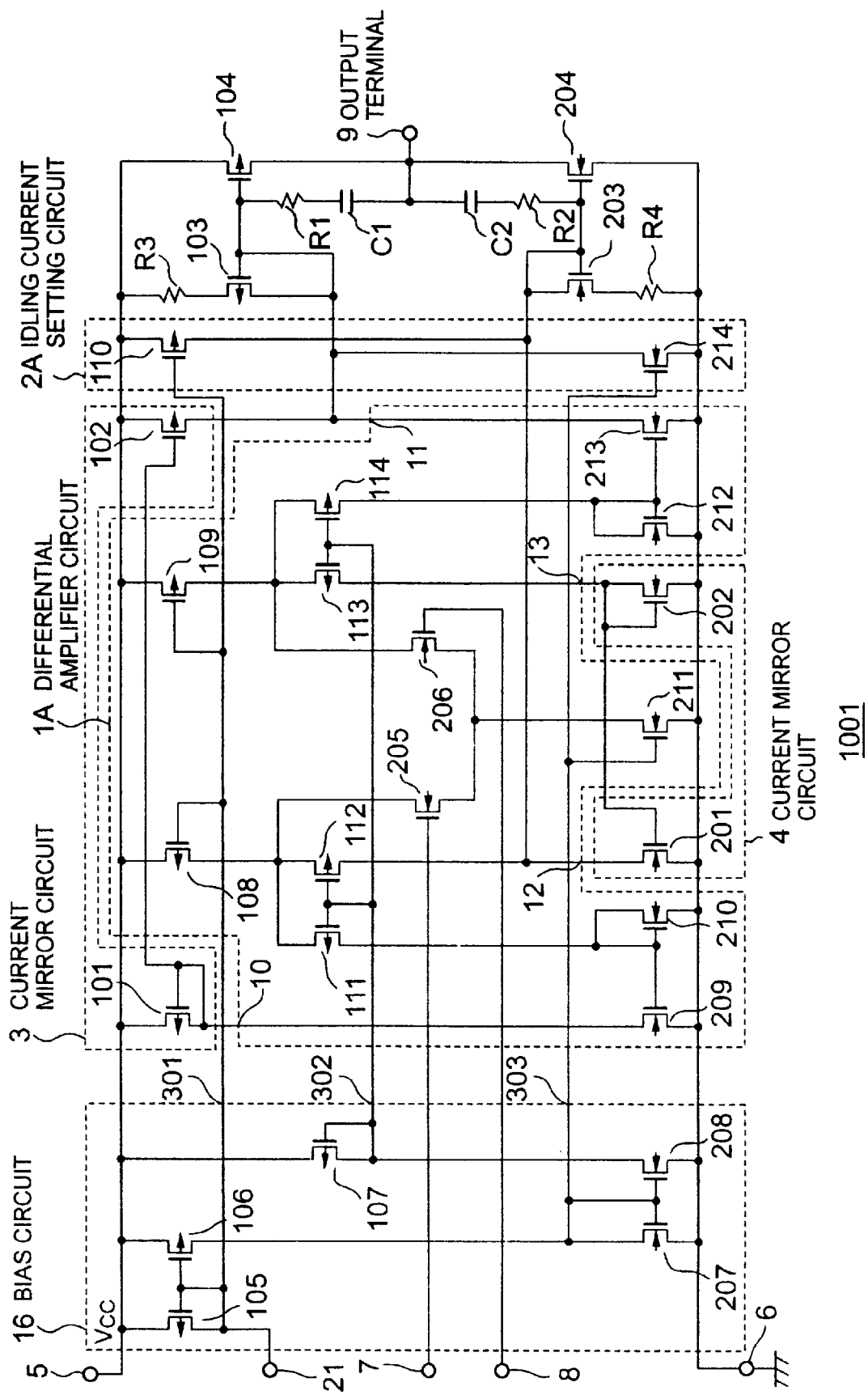
FIG. 3 is a circuit diagram showing the configuration of an operational amplifier according to a second embodiment of the present invention.

FIG. 3 is a circuit diagram showing the configuration of the operational amplifier circuit 1001 according to the second embodiment of the present invention. As shown in FIG. 3, the operational amplifier circuit 1001 comprises: a bias current setting terminal 21, which sets a target bias current of a bias circuit 16; as well as an external terminal or power supply terminal 5; a ground terminal 6; a non-inverted input terminal 7; an inverted input terminal 8; and an output terminal 9.

The bias circuit 16, comprised of p-channel transistors 105 and 106 and n-channel transistors 107, 207 and 208, outputs a bias voltage to a differential amplifier circuit 1A and an idling current setting circuit 2A via output terminals 301, 302, and 303 of the bias circuit 16, by applying a constant current to the bias current setting terminal 21.

The differential amplifier circuit 1A, connected in a folded-cascade manner, is comprised of p-channel transistors 108, 109, 111, 112, 113, and 114 and n-channel transistors 205, 206, and 209 to 213. It also comprises a non-inverted current inflow terminal 11, an inverted current inflow terminal 10, a non-inverted current outflow terminal 13, and an inverted current outflow terminal 12.

The drain of a p-channel transistor 102, which makes up a current mirror circuit 3, the gate of a p-channel output transistor 104, the gate of a load transistor 103, and the drain of the n-channel transistor 214, which sets an idling current, are all connected to the non-inverted current inflow terminal 11.

The drain of an n-channel transistor 201 which makes up a current mirror circuit 4, the gate of an n-channel output transistor 204, the gate of a load transistor 203, and the drain of a p-channel transistor 110 are all connected to the inverted current outflow terminal 12.

An idling current setting circuit 2A is comprised of the p-channel transistor 110 and the n-channel transistor 214. The p-channel transistor 110 allows an idling current to flow through the n-channel output transistor 204, whereas the n-channel transistor 214 allows an idling current to flow through the p-channel output transistor 104.

The drains of the p-channel output transistor 104 and the n-channel output transistor 204 are both connected to the output terminal 9, wherein an output signal of the operational amplifier circuit 1001 is output to the output terminal 9.

The source of the load transistor 103 is connected to the power supply terminal 5 via a resistor R3. The source of the load transistor 203 is connected to the ground terminal 6 via a resistor R4. The gate of the p-channel output transistor 104 is connected to the output terminal 9 via a resistor R1 and a condenser C1. In the same manner, the gate of the n-channel output transistor 204 is connected to the output terminal 9 via a resistor R2 and a condenser C2.

The gate of the n-channel transistor 214, which allows an idling current to flow, is connected to an output terminal 303 of the bias circuit 16. In the same manner, the gate of the p-channel transistor 110 is connected to an output terminal 301 of the bias circuit 16.

Next, the operation of the operational amplifier circuit 1001 as shown in FIG. 3 will be explained below.

First, the operation of the operational amplifier circuit 1001 when no signal enters and when a low amplitude of signals enter, will be explained with reference to FIGS. 2 to 4. We assume that: a voltage follower is structured by connecting the inverted input terminal 8 to the output terminal 9; the power supply voltage is equal to 3 volts; and a sine wave with its peak value of 20 mV enters the non-inverted input terminal 7. In this condition, reference numerals a, b, c, d, and e depict: an output voltage waveform appearing at the output terminal 9; and voltage waveforms appearing at: the inverted current inflow terminal 10, the non-inverted current inflow terminal 11, the inverted current outflow terminal 12, and the non-inverted current outflow terminal 13, respectively. These voltage waveforms are all shown along the axis of ordinates at the left side in FIG. 4. On the other hand, a current wave form f of the n-channel output transistor 204 and a current wave form g of the p-channel output transistor 104 are both shown along the axis of ordinates on the right side.

The voltage waveforms d and e at the inverted current outflow terminal 12 and the non-inverted current outflow terminal 13, respectively, of the differential amplifier circuit 1A are both maintained as in vicinity of 0.6 volts which is somewhat higher than a threshold voltage Vtn of n-channel transistor, by the n-channel transistors 203 and 204, each being internally connected as a diode.

The voltages b and c at the inverted current inflow terminal 10 and the non-inverted current inflow terminal 11 are respectively maintained as a voltage which is somewhat lower than the power supply voltage Vcc (=3 volts) minus the threshold voltage of p-channel transistor by the p-channel transistors 101 and 103, each being internally connected as a diode.

The idling current flowing through the p-channel output transistor 104 and the n-channel output transistor 204 is determined as an approximately 200 microamperes from the combination of: a current set at the bias current setting terminal 21; the ratio of the gate width of the n-channel transistor 207 to that of the n-channel transistor 214; the ratio of the gate width of the p-channel transistor 105 to that of the p-channel transistor 115; the ratio of the gate width of the p-channel transistor 103 to that of the n-channel transistor 104; and the ratio of the gate width of the n-channel transistor 203 to that of the n-channel transistor 204.

Figure 4:
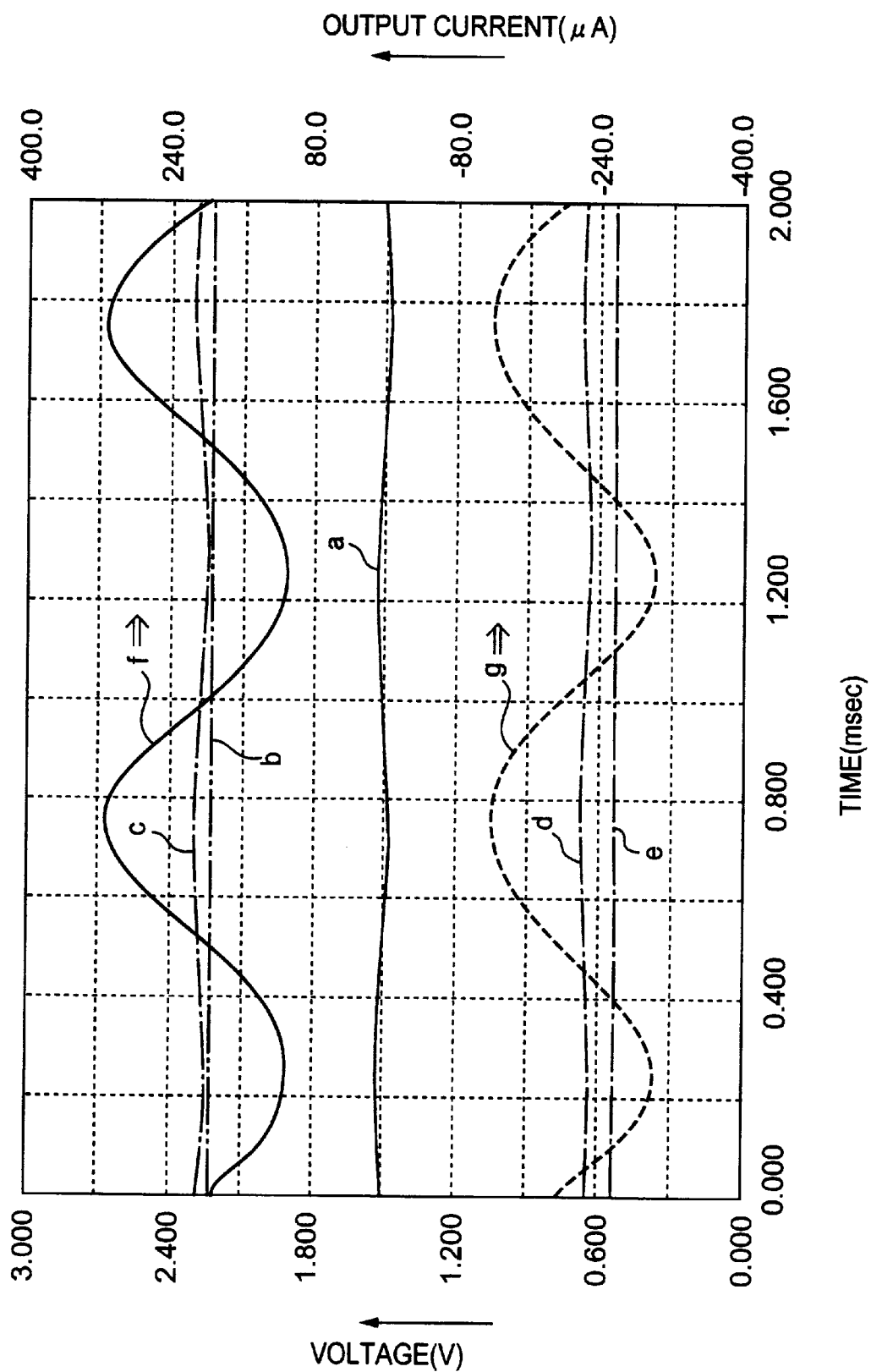
FIG. 4 shows waveforms explaining the operation of the operational amplifier according to the second embodiment of the present invention as shown in FIG. 3, when no signal or a low amplitude of signals enter.

As is apparent from FIG. 4, the drain currents f and g of the p-channel output transistor 104 and the n-channel output transistor 204 do not cut off so that they can operate as a class A amplification.

Figure 5:
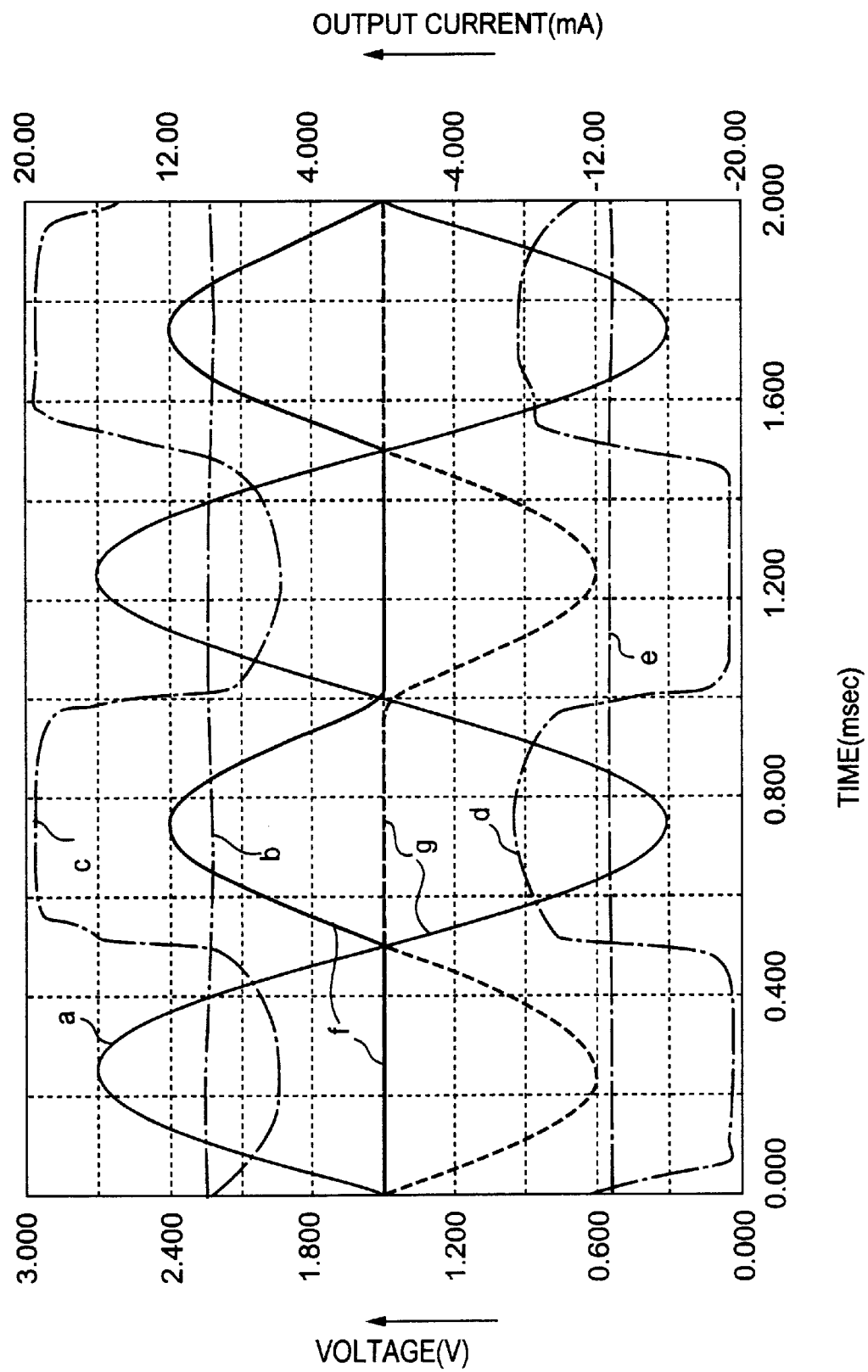
FIG. 5 shows waveforms explaining the operation of the operational amplifier according to the second embodiment of the present invention as shown in FIG. 3, when a high amplitude of signals enter.

Next, the operation of the operational amplifier circuit 1001 when large amplitude signals enter will be explained with reference to FIG. 5.

We assume that the same measurement condition and configuration of a voltage follower as those shown in the above are used where a sine wave with its peak value of 1.2 volts enters the non-inverted input terminal 7. The voltage waveforms a, b, c, d, and e and the current waveforms f and g denote the same as those when no signal enters and when a low amplitude of signals enter as described above.

The voltage waveforms b and e at the inverted current inflow terminal 10 and the non-inverted current outflow terminal 13 are the same as those when the low amplitude of signals enter. However, the voltage waveforms c and d at the non-inverted current inflow terminal 11 and the inverted current outflow terminal 12 greatly change so that they drive the p-channel output transistor 104 and the n-channel output transistor 204, respectively.

During the period of half wave when a relationship: Voltage d>Voltage e or Voltage c>Voltage b, is almost satisfied, the n-channel output transistor 204 turns on whereas the p-channel output transistor 104 turns off.

On the other hand, during the period of half wave when a relationship: Voltage c<Voltage b or Voltage d<Voltage e is almost satisfied, the p-channel output transistor 104 turns on whereas the n-channel output transistor 204 turns off.

Drain currents g and f of the p-channel output transistor 104 and the n-channel output transistor 204 are equal to 12 mA when a load resister (not shown in drawings), connected to the output terminal 9, has a resistance of 100 ohm, and 120 mA, 10 ohm, so that the drain currents alternatively flow through the transistors 104 and 204. That is to say, the transistors 104 and 204 operate as a class B amplifier.

In summary, as apparent from FIG. 3, the maximum, gate drive voltages of the p-channel output transistor 104 and the n-channel output transistor 204 are determined by the resistances R3 and R4. This enables an increase in the maximum drive voltage irrelevant to the idling current and an increase in the maximum output current of the operational amplifier circuit 1001.

Furthermore, since the inverted cascade-type differential amplifier circuit 1A is structured with the non-doped n-channel transistors 205 and 206 with their threshold voltages of in vicinity of 0 volt, it is possible for the operational amplifier circuit 1001 to input voltages ranging from the nearly earth voltage to the power supply voltage. In addition to that, since the operational amplifier circuit 1001 is powered by a power supply which supplies a voltage being equal to or more than the sum of the voltage between the source and drain of the transistor and the threshold voltage, an operational amplifier circuit can operate, powered by a power supply which supplies a voltage of 1 volt or less even though the ordinary CMOS manufacturing process is utilized.

In the above explanation, the gate drive voltage of the p-channel output transistor 104 is increased when a high amplitude of signals enter, by connecting the source of the load transistor 103 to the resistor R3. However, a p-channel transistor, the gate of which is fixed to the earth level, can be used in place of the resistor R3. In the same manner, a n-channel transistor, the gate of which is fixed to the supply voltage, can be used in place of R4. The resistors R3 and R4 have high resistances of 250 Kohm so that relatively large areas are occupied when the ordinary CMOS manufacturing process is used to manufacture. However, using MOS-type transistors in place of them enables making the areas smaller.

Next, an operational amplifier circuit according to a third embodiment of the present invention will be explained with reference to FIG. 6.

Figure 6:
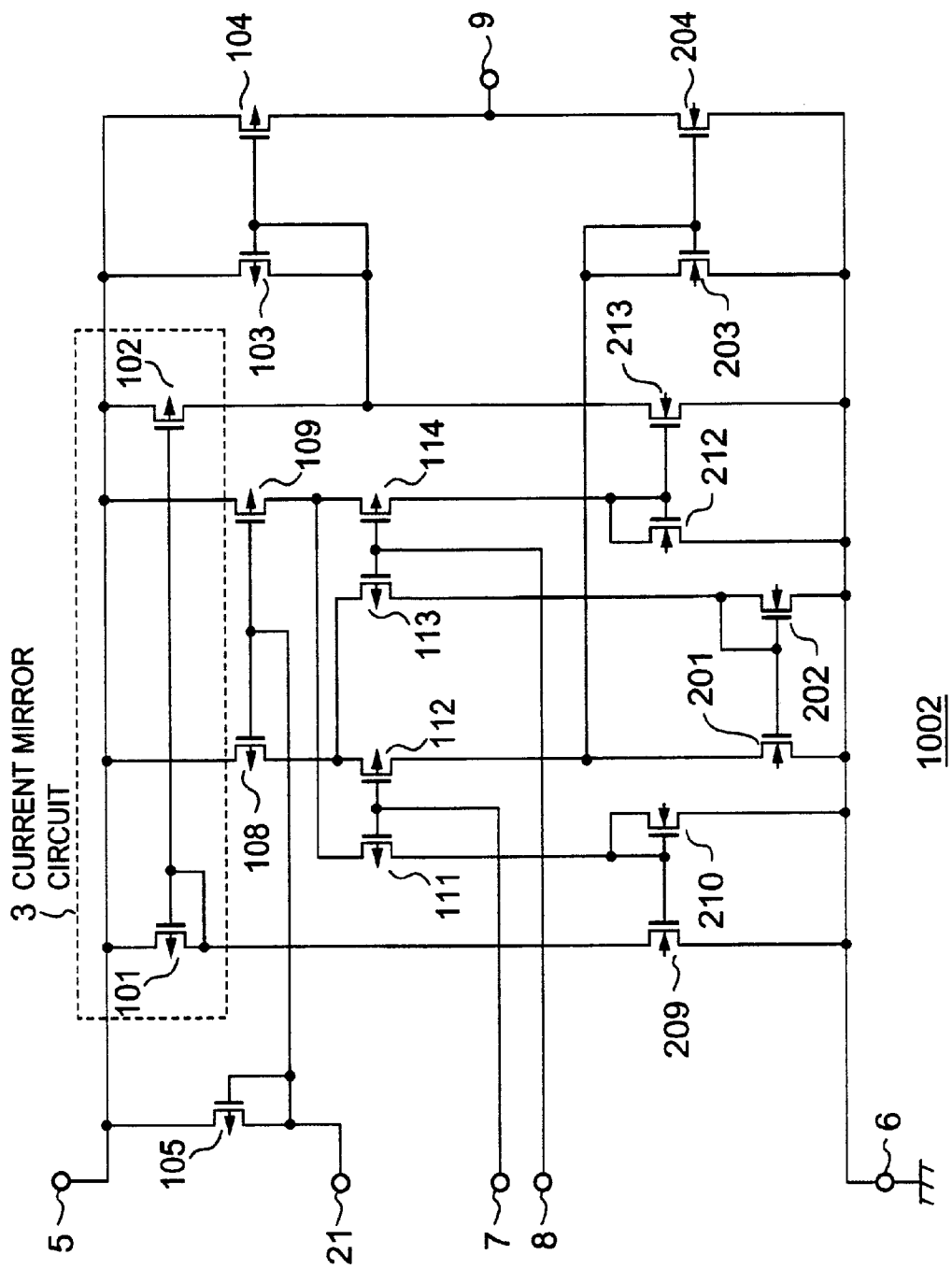
FIG. 6 is a circuit diagram showing the configuration of an operational amplifier according to a third embodiment of the present invention.

FIG. 6 is a circuit diagram showing an operational amplifier circuit 1002 according to a third embodiment of the present invention. Since a differential amplifier circuit, which makes up the operational amplifier circuit 1002, is comprised of p-channel transistors 111 to 114, the operational amplifier circuit is simplified more than the operational amplifier circuit 1001 as shown in FIG. 3.

In addition, an idling current flowing through a p-channel output transistor 104 and a n-channel output transistor 204 is determined by decreasing the gate widths of the p-channel transistor 102 and the n-channel transistor 201 by 5% from the gate widths of the p-channel transistor 101 and the n-channel transistor 202, respectively, so that the differential amplifier circuit 1002 flows in and out a constant current even when no signal enters.

Since enhancement-type p-channel transistors 112, and 113 are used at the input stage of the differential amplifier circuit in the operational amplifier circuit 1002, there is a feature where a common-mode input voltage can range down to below the earth level.

Figure 7:
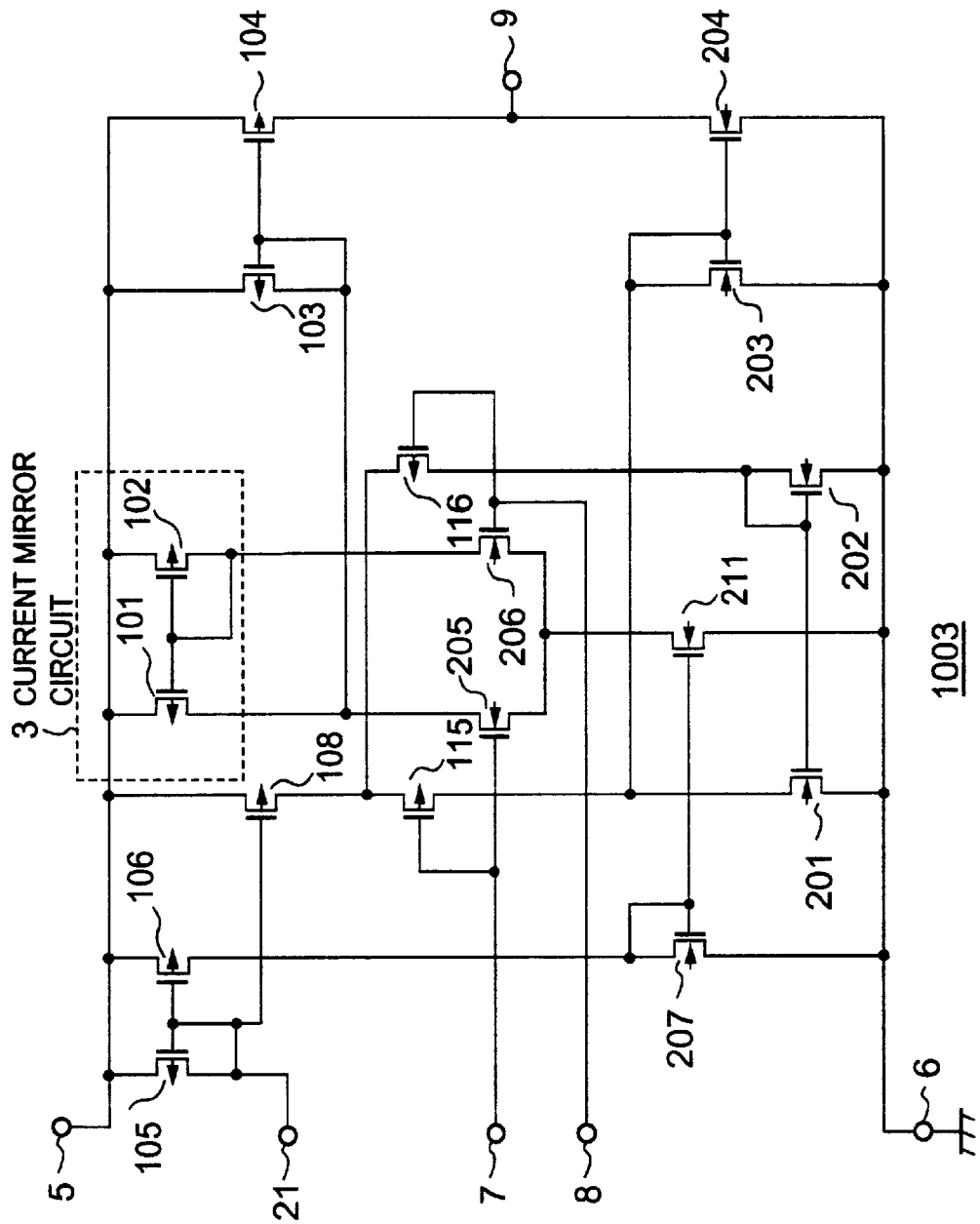
FIG. 7 is a circuit diagram showing the configuration of an operational amplifier according to a fourth embodiment of the present invention.

Next, an operational amplifier circuit 1003 according to a fourth embodiment of the present invention will be explained with reference to FIG. 7.

The operational amplifier circuits as shown in FIGS. 3 and 6 are configured in such a manner that: a pair of differential transistors such as n-channel transistors or p-channel transistors are used for the differential amplifier circuit; a current output from the differential amplifier circuit flows through and turns up at the current mirror circuit, which is made up of the n-channel transistors 209 and 210, and the current mirror circuit, which is made up of the n-channel transistors 212 and 213; and thereafter the current mirror circuit 3, made up of the p-channel transistors 101 and 102, drives the p-channel output transistor 104. Alternatively, as shown in FIG. 7, a pair of n-channel transistors 205 and 206, which differentially amplify an input signal, outputs an amplified signal driving a p-channel output transistor 104, whereas a pair of p-channel transistors 115 and 116, which differentially amplify the input signal, output an amplified signal driving an n-channel output transistor 204.

The operational amplifier circuit 1003 is configured in such a manner that the path for an amplified signal to travel from a pair of p-channel transistors 115 and 116 which differentially amplify an input signal, to an n-channel output transistor 204, and the path for an amplified signal to travel from a pair of n-channel transistors 205 and 206 which also differentially amplify the input signal, to a p-channel output transistor 104 are symmetric. This enables a provision of an operational amplifier circuit with a high performance when it operates at a high speed.

Next, an operational amplifier method according to the present invention will be described with reference to FIG. 8. FIG. 8 is a flowchart showing an operating steps of operationally amplifying a signal.

In step S1, a signal (e.g., a differential signal) is input. In step S2, the differential signal is differentially amplified and an amplified pair of a current signal and an current signal are output. In step 3, it is determined whether the amplified, non-inverted current signal is less than or equal to a given constant current. If yes, a signal corresponding to the sum of the amplified, non-inverted current signal and the given constant current, also corresponding to the amplified, inverted current signal and the given constant current, is output in a class A amplification mode, in step S4. Otherwise, if no, the signal is output in a class B amplification mode, in step S5.

In steps S4 and S5, outputting the signal can be performed in such a way that the amplified, non-inverted current signal and the amplified, inverted current signal, which have been output in step S2, drive transistors which perform a push-pull operation, respectively.

In summary, the operational amplification is done by the combination of the A class amplification operation and the B class amplification operation.

The first to fourth embodiments are provided utilizing the operational amplifier method as described above. However, this method is not limited to the configurations as shown in the first to fourth embodiment. On the contrary, all alternatives, modifications, and equivalents utilizing this method can be included within the spirit and scope of the present invention.

As described above, an operational amplifier according to the present invention can separately set the capability of driving a load and an idling current at an output stage. This allows for the capability of driving a heavy load; and for a low dissipation current when a low amplitude of signals enter.

In addition, since the voltages at the current output terminals in the differential amplifier circuit are balanced when a low amplitude of signals enter, there is a feature where: an influence of possible changes in the power supply voltage is not great and thus the Supply Voltage Rejection Ratio (SVRR) is high.

Furthermore, since the output stage is made up of a complementary common source circuit, allowable output voltages range from almost the earth voltage to the power supply voltage.

Furthermore, when a non-doped n-channel transistor, whose threshold voltage is in vicinity of 0 volt is utilized making up an inverted cascade-type differential amplifier circuit, the operational amplifier circuit can normally amplify the input voltages ranging from almost the earth voltage to the power supply voltage. Where, since it operates with the help of a power supply voltage which is equal to or more than the sum of the voltage between the source and the drain of the transistor and the threshold voltage, an ordinary CMOS manufacturing process can be utilized providing an operational amplifier, which can be powered by a power supply which supplies a voltage of 1 volt or less.

Furthermore, a desired idling current flowing through the p-channel output transistor and the n-channel output transistor can be easily set by setting the ratio of the gate widths of a p-channel transistor to an n-channel transistor, which along with the p-channel output transistor and the n-channel output transistor, respectively, make up current mirror circuits, separately. The idling current is determined in such a way that it flows in and out of the differential amplifier, as a constant current, even when no signal enters.

Furthermore, in the above embodiments, CMOS transistors are utilized. Needless to say, however, they can be configured by using BiCMOS transistors so that the frequency characteristics of the operational amplifier according to the present invention may be improved.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the present invention.

What is claimed is:

1. An operational amplifying method comprising the steps of:
   amplifying an input signal to produce an amplified signal;
   determining whether said amplified signal is small by comparing said amplified signal to a predetermined constant current, wherein said amplified signal is small if said amplified signal is less than or equal to said predetermined constant current, and said amplified signal is large if said amplified signal is greater than said predetermined constant current;
   amplifying said amplified signal in a class A amplification mode when said amplified signal is small; and
   amplifying said amplified signal in a class B amplification mode when said amplified signal is large.

2. The operational amplifying method according to claim 1, wherein said amplified signal includes an amplified, non-inverted current signal and an amplified, inverted current signal.

3. The operational amplifying method according to claim 2, wherein said amplified signal is small if said amplified, non-inverted current signal is less than or equal to said predetermined constant current.

4. The operational amplifying method according to claim 3, wherein said class B amplification is performed by driving a pair of transistors, one transistor being driven by the sum of said amplified, non-inverted current signal and said predetermined constant current, and the other transistor being driven by the sum of said amplified, inverted current signal and said predetermined constant current.

5. An operational amplifier for amplifying an input signal, the operational amplifier comprising:
   an amplifier which amplifies the input signal to produce an amplified signal;
   an idling current provider which provides a constant current; and
   a driver which outputs an output signal based on the sum of the amplified signal and the constant current,
   wherein said driver functions in a class A amplification mode when said amplified signal is less than or equal to said constant current, and functions in a class B amplification mode when said amplified signal is greater than said constant current.

6. The operational amplifier according to claim 5, wherein said amplified signal includes an amplified, non-inverted current signal and an amplified, inverted current signal.

7. The operational amplifier according to claim 6, wherein said amplified signal is small if said amplified, non-inverted current signal is less than or equal to said constant current.

8. The operational amplifier according to claim 7, wherein said driver includes a pair of transistors, one transistor being driven by the sum of said amplified, non-inverted current signal and said constant current, and the other transistor being driven by the sum of said amplified, inverted current signal and said constant current.

9. The operational amplifier according to claim 5, wherein said amplifier is a folded cascade-type differential amplifier.

10. The operational amplifier according to claim 7, wherein:
   said driver includes a pair of transistors; and
   said amplifier includes a pair of n-channel transistors and a pair of p-channel transistors, each pair forming a differential amplifier, wherein said pair of n-channel transistors amplify the input signal so as to drive one transistor of said driver and said pair of p-channel transistors amplify the input signal so as to drive the other transistor of said driver.

11. The operational amplifier according to claim 8, wherein said pair of transistors of the driver conduct a push-pull operation.

12. An operational amplifier, comprising:

an amplifier which amplifies an input signal into an amplified, non-inverted current signal and an amplified, inverted current signal, an idling current provider which provides a constant current signal; and a driver outputting an output signal, said driver including a pair of transistors, one of said transistors being driven by a voltage based on the sum of said amplified, non-inverted current signal and said constant current signal, and said other transistor being driven by a voltage based on the sum of said amplified, inverted current signal and said constant current signal, wherein said pais of transistors are driven at the same time.

13. The operational amplifier according to claim 12, wherein said amplifier is a folded cascade-type differential amplifier.

14. The operational amplifier according to claim 12, wherein said amplifier includes enhancement-type p-channel transistors.

15. The operational amplifier according to claim 12, wherein said amplifier includes a pair of n-channel transistors and a pair of p-channel transistors, each pair forming a differential amplifier, wherein said pair of n-channel transistors amplify said input signal, and one of said transistors of said driver is driven by a voltage based on said input signal amplified by said pair of n-channel transistors, and wherein said pair of p-channel transistors amplify said input signal, and said other transistor of said driver is driven by a voltage based on said input signal amplified by said pair of p-channel transistors.

* * * * *